(12) United States Patent
Morita et al.

(10) Patent No.: US 6,780,764 B2
(45) Date of Patent: Aug. 24, 2004

(54) METHOD OF FORMING A PATTERNED TUNGSTEN DAMASCENE INTERCONNECT

(75) Inventors: Tomoyuki Morita, Tokyo (JP); Yusuke Harada, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 10/316,852

(22) Filed: Dec. 12, 2002

(65) Prior Publication Data

US 2003/0119303 A1 Jun. 26, 2003

Related U.S. Application Data

(62) Division of application No. 09/713,026, filed on Nov. 16, 2000, now abandoned.

(30) Foreign Application Priority Data

Jan. 24, 2000 (JP) .......................................... 2000-14439

(51) Int. Cl.[7] ...................... H01L 21/44; H01L 21/4763
(52) U.S. Cl. ...................... 438/656; 438/628; 438/629; 438/648; 438/675; 438/685
(58) Field of Search ................................. 438/683, 685, 438/656, 675, 648, 627, 628, 629

(56) References Cited

U.S. PATENT DOCUMENTS

| | | | |
|---|---|---|---|
| 5,279,857 A | | 1/1994 | Eichman et al. |
| 5,308,655 A | | 5/1994 | Eichman et al. |
| 5,591,672 A | * | 1/1997 | Lee et al. ..................... 438/533 |
| 5,975,912 A | | 11/1999 | Hillman et al. |
| 6,051,281 A | * | 4/2000 | Kobayashi et al. .......... 427/535 |
| 6,136,690 A | * | 10/2000 | Li ............................... 438/627 |
| 6,309,966 B1 | * | 10/2001 | Govindarajan et al. ..... 438/656 |

* cited by examiner

Primary Examiner—Erik Kielin
(74) Attorney, Agent, or Firm—Volentine Francos, PLLC

(57) ABSTRACT

A method for forming a semiconductor device includes providing a semiconductor substrate, forming an insulating film having a opening, forming a titanium film so as to extend from the semiconductor substrate in the opening to the insulating film surface, plasma treating the titanium film with a mixed gas of hydrogen and nitrogen; and forming a titanium nitride on the titanium film. Accordingly, the method can decrease a contact resistance of the tungsten interconnection in a contact hole.

5 Claims, 2 Drawing Sheets

METHOD OF FORMING A PATTERNED TUNGSTEN DAMASCENE INTERCONNECT

CROSS REFERENCE TO RELATED APPLICATIONS

This is a divisional application of application Serial No. 09/713,026, filed Nov. 16, 2000 now abandoned, which is hereby incorporated by reference in its entirety for all purposes.

BACKGROUND OF THE INVENTION

1. Field of the Invention

The present invention generally relates to a method for forming a semiconductor device, and more particularly, the present invention relates to a method for forming titanium and titanium nitride for using as adhesion layer.

This application is a counterpart of Japanese application Serial Number 14439/2000, filed Jan. 24, 2000, the subject matter of which is incorporated herein by reference.

2. Description of the Related Art

In general, as high-integration advances, tungsten interconnection utilized tungsten has been a focus of constant attention because step coverage is fine.

FIG. 1A through FIG. 1D are cross-sectional views showing a method for forming a semiconductor device according to a conventional art. As shown in FIG. 1A, an insulating film 2 having a contact hole 3 is formed on a silicon substrate 1. A part of the silicon substrate 1 is exposed from the contact hole 3.

As shown in FIG. 1B, using CVD (Chemical Vapor Deposition) technique, a titanium film 4 is formed on the insulating film 2 and the exposed silicon substrate 1 surface. Here, the CVD technique is carried out introducing titanium tetrachloride and hydrogen gas. Then, the titanium film 4 is treated with nitrogen plasma ion. Therefore, the nitrogen plasma ion is generated using ammonia, and the titanium film 4 reacts with the nitrogen plasma ion. Then, a titanium nitride film 5 is formed on the plasma treated titanium film 4 using the CVD technique. Here, the CVD technique is carried out introducing titanium tetrachloride and ammonia gas.

As shown in FIG. 1C, for decreasing low resistance, the titanium nitride film 5 is annealed in the atmosphere of ammonia. Then, a tungsten film 6 is formed on the annealed titanium nitride film 5. Then, the tungsten film 6 is etched back. As a result, the tungsten film 6 is buried in the contact hole 3.

As described above, the plasma treating of ammonia is carried to increase adhesion between the titanium film 4 and a titanium nitride film.

However, since the plasma treating of ammonia has a high nitriding speed for titanium, the titanium film is completely converted the titanium nitride film. Besides, the silicon substrate 1 surface under the titanium film is also nitridized. Therefore, a silicon nitride is formed on the silicon substrate 1 surface. As a result, a contact resistance of the tungsten interconnection in a contact hole, is increased.

It is desired to decrease a contact resistance of the tungsten interconnection in a contact hole.

SUMMARY OF THE INVENTION

An object of the present invention is to provide a method for forming a semiconductor device that can decrease a contact resistance of the tungsten interconnection in a contact hole.

According to one aspect of the present invention, for achieving the above object, there is provided a method for forming a semiconductor device comprising: providing a semiconductor substrate; forming an insulating film having a opening; forming a titanium film so as to extend from the semiconductor substrate in the opening to the insulating film surface; plasma treating the titanium film with a mixed gas of hydrogen and nitrogen; and forming a titanium nitride on the titanium film.

BRIEF DESCRIPTION OF THE DRAWINGS

While the specification concludes with claims particularly pointing out and distinctly claiming the subject matter that is regarded as the invention, the invention, along with the objects, features, and advantages thereof, will be better understood from the following description taken in connection with the accompanying drawings, in which:

DETAILED DESCRIPTION OF THE PREFERRED EMBODIMENTS

A prober and a method for forming the same according to a preferred embodiment of the present invention will hereinafter be described in detail with reference to the accompanying drawings.

FIG. 2A through FIG. 2D are cross-sectional views showing a method for forming a semiconductor device according to a preferred embodiment of the invention.

Figure 1A:
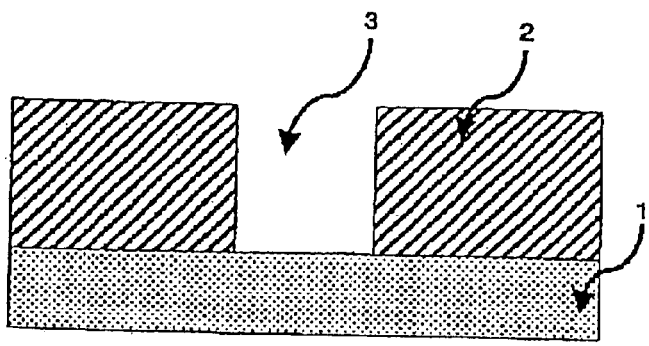
FIG. 1A through FIG. 1D are cross-sectional views showing a method for forming a semiconductor device according to a conventional art.
Figure 1B:
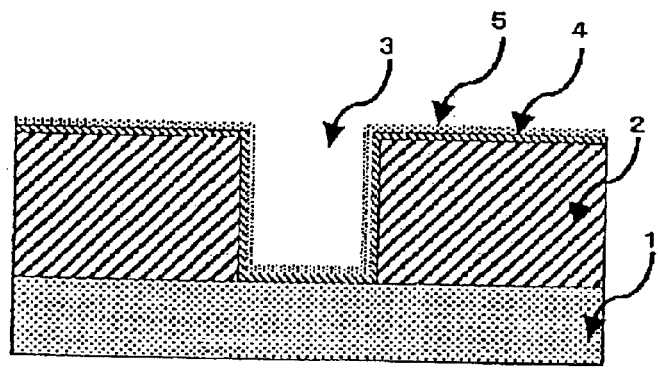
Figure 1C:
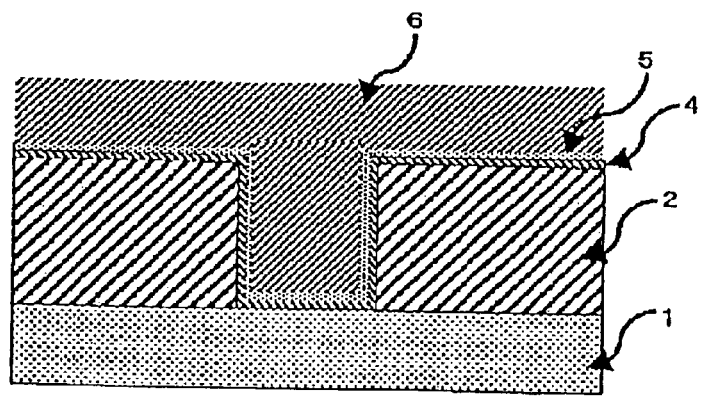
Figure 1D:
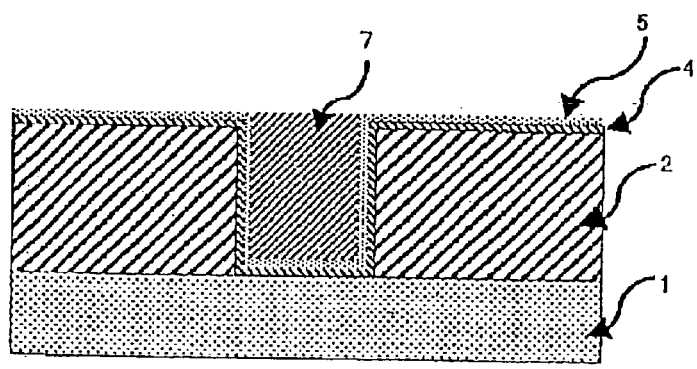
Figure 2A:
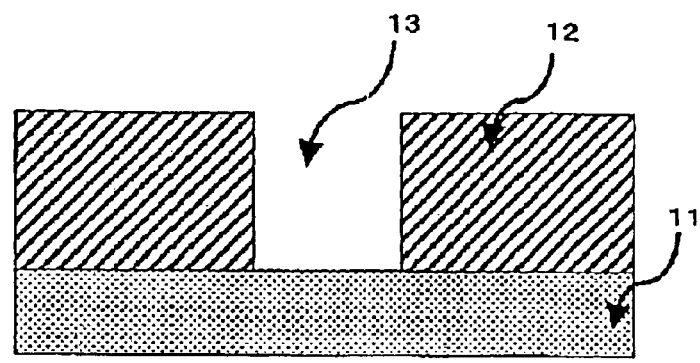
FIG. 2A through FIG. 2D are cross-sectional views showing a method for forming a semiconductor device according to a preferred embodiment of the invention.

As shown in FIG. 2A, an insulating film 12 is formed on an N type silicon substrate 11. For example, the insulating film 12 having a thickness of 1.0 $\mu$m is $SiO_2$ film. The N type silicon substrate 11 has an impurity concentration of $5 \times 10^{15}$ $cm^{-2}$.

Then, a contact hole 13 is formed in the insulating film 12 on a predetermined portion of the $SiO_2$ film 13, using the well-known photolithography technique. An opening diameter of the contact hole 13 is 0.2 $\mu$m. A part of the silicon substrate 11 is exposed from the contact hole 13.

Figure 2B:
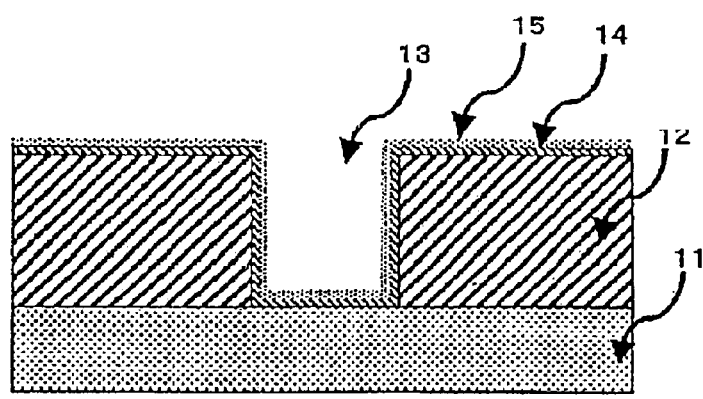

As shown in FIG. 2B, using CVD (Chemical Vapor Deposition) technique, a titanium film 14 is formed on the insulating film 12 and the exposed silicon substrate 11 surface in the contact hole 13. Here, conditions of the CVD are as follows.

(1) Gases: titanium tetrachloride and hydrogen.
(2) Gas flow rate: titanium tetrachloride: 5[sccm], and hydrogen: 1500[sccm].
(3) Pressure: 500[pa].
(4) Wafer temperature: 650[° C.].
(5) Thickness: 20[nm].
(6) Given power: 450[W].

Then, the titanium film 14 is treated with nitrogen plasma ion.

Here, conditions of the plasma treating are as follows.

(1) Gases: hydrogen and nitrogen.
(2) Gas flow rate: hydrogen: 1000–2000[sccm] and nitrogen: 400–600[sccm].
(3) Pressure: 500[pa].
(4) Wafer temperature: 650[° C.].

(5) Thickness: 20[nm].

(6) Given power: 400–500[W].

Then, a titanium nitride film 15 is formed on the plasma treated titanium film 14 using the CVD technique. Here, conditions of the CVD are as follows.

(1) Gases: titanium tetrachloride and ammonia.

(2) Gas flow rate: titanium tetrachloride: 30–50[sccm] and ammonia: 300–500[sccm].

(3) Pressure: 70[pa].

(4) Wafer temperature: 650[° C.].

(5) Thickness: 20[nm].

Figure 2C:
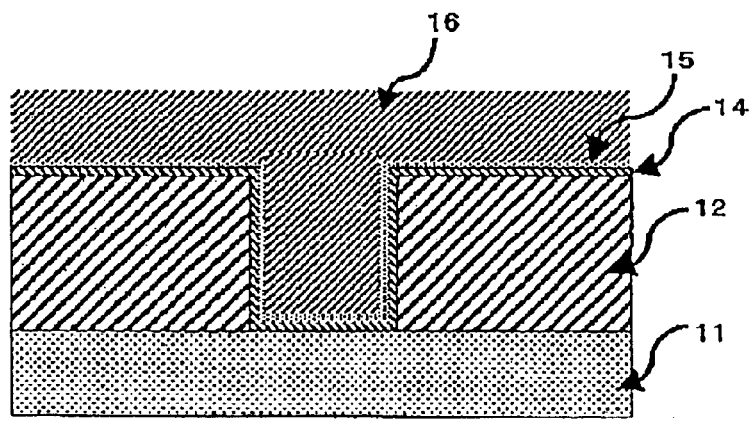
Figure 2D:
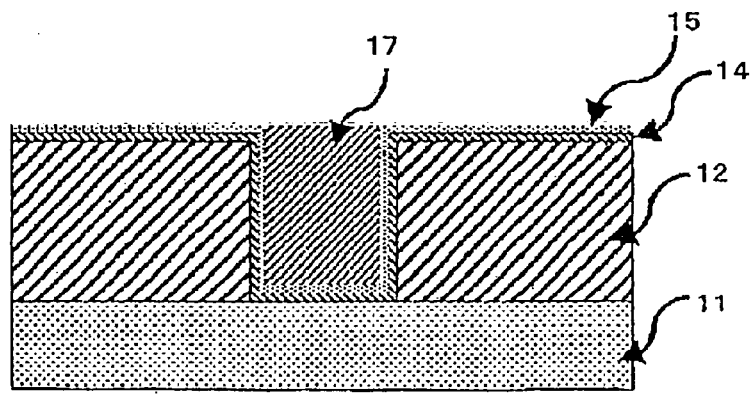

As shown in FIG. 2C, for decreasing low resistance, the titanium nitride film 15 is annealed in the atmosphere of ammonia.

Here, conditions of the annealing are as follows.

(1) Gas flow rate: ammonia: 3000[sccm].

(2) Pressure: 1000[pa].

(3) Wafer temperature: 650[° C.].

(4) Time: 20[sec].

Then, a tungsten film 16 is formed on the annealed titanium nitride film 15. The tungsten film forming processes have first and second CVD. Here, conditions of the first and second CVD are as follows.

First CVD:

(1) Gases: tungsten hexafluoride and silane.

(2) Gas flow rate: tungsten hexafluoride: 20[sccm] and silane: 10[sccm].

(3) Pressure: 500[pa].

(4) Wafer temperature: 500[° C.].

(5) Thickness: 25[nm].

Second CVD:

(1) Gases: tungsten hexafluoride and hydrogen.

(2) Gas flow rate: tungsten hexafluoride: 90[sccm] and hydrogen: 1000[sccm].

(3) Pressure: 10000[pa].

(4) Wafer temperature: 500[° C.].

(5) Thickness: 500[nm].

Then, the tungsten film 16 is etched back. As a result, the tungsten film 17 is buried in the contact hole 13.

The tungsten film forming process may be carried out without the etching back process.

As mentioned above, the preferred embodiment of the invention is characterized as follows.

First, to increase adhesion between the titanium film and a titanium nitride film, the plasma treating is carried out with a mixed gas of hydrogen and nitrogen. The mixed gas of hydrogen and nitrogen has a nitriding speed for titanium less than ammonia. As a result, the preferred embodiment of the invention can avoid the problem that the titanium film is completely converted the titanium nitride film, the silicon substrate 1 surface under the titanium film is also nitridized.

Accordingly, the preferred embodiment of the invention can decrease a contact resistance of the tungsten interconnection in a contact hole.

While the present invention has been described with reference to the illustrative embodiments, this description is not intended to be construed in a limiting sense. Various modifications of the illustrative embodiments, as well as other embodiments of the invention, will be apparent to those skilled in the art on reference to this description. It is therefore contemplated that the appended claims will cover any such modifications or embodiments as fall within the true scope of the invention.

What is claimed is:

1. A method for forming a semiconductor device comprising:

providing a semiconductor substrate;

forming an insulating film on the semiconductor substrate, the insulating film having an opening;

forming a titanium film so as to extent from the semiconductor substrate in the opening to a surface of the insulating film;

plasma treating the titanium film with a mixed gas of hydrogen and nitrogen:

forming a titanium nitride on the plasma treated titanium film;

annealing the titanium nitride with ammonia;

forming a tungsten film on the annealed titanium nitride; and forming a tungsten interconnection by patterning the tungsten film.

2. A method for forming a semiconductor device as claimed in claim 1, wherein the annealing is carried out for 20 seconds and has a condition that gas flow rate of the ammonia is 3000 sccm, a pressure is 1000 pa, and a temperature is 650° C.

3. A method for forming a semiconductor device as claimed in claim 1, wherein said forming a titanium film has a condition that gases are titanium tetrachloride and hydrogen, gas flow rates are 5 sccm for titanium tetrachloride and 1500 sccm for hydrogen, pressure is 500 pa, temperature is 650° C., thickness of the titanium film is 20 nm, and power is 450 W.

4. A method for forming a semiconductor device as claimed in claim 1, wherein said plasma treating has a condition that gas flow rates are 1000–2000 sccm for hydrogen and 400–600 sccm for nitrogen, a pressure is 500 pa, a temperature is 650° C., a thickness of the plasma treated titanium film is 20 nm, and a power is 400–500 W.

5. A method for forming a semiconductor device as claimed in claim 1, wherein said forming a titanium nitride has a condition that gases are titanium tetrachloride and ammonia, gas flow rates are 30–50 sccm for titanium tetrachloride and 300–500 sccm for ammonia, a pressure is 70 pa, a temperature is 650° C., and a thickness of the titanium nitride is 20 nm.

* * * * *

UNITED STATES PATENT AND TRADEMARK OFFICE
CERTIFICATE OF CORRECTION

PATENT NO. : 6,780,764 B2
APPLICATION NO. : 10/316852
DATED : August 24, 2004
INVENTOR(S) : Tomoyuki Morita et al.

It is certified that error appears in the above-identified patent and that said Letters Patent is hereby corrected as shown below:

Delete columns 3 and 4 in their entirety and insert columns 3 and 4 as attached

Signed and Sealed this

Twenty-seventh Day of July, 2010

David J. Kappos
*Director of the United States Patent and Trademark Office*

(5) Thickness: 20[nm].

(6) Given power: 400-500[W].

Then, a titanium nitride film 15 is formed on the plasma treated titanium film 14 using the CVD technique. Here, conditions of the CVD technique. Here, conditions of the CVD are as follows.

(1) Gases: titanium tetrachloride and ammonia.

(2) Gas flow rate: titanium tetrachloride: 30-50[sccm] and ammonia: 300-500[sccm].

(3) Pressure: 70[pa].

(4) Wafer temperature: 650[° C.].

(5) Thickness: 20[nm].

As shown in FIG. 2C, for decreasing low resistance, the titanium nitride film 15 is annealed in the atmosphere of ammonia.

Here, Conditions of the annealing are as follows.

(1) Gas flow rate: ammonia: 3000[sccm].

(2) Pressure: 1000[pa].

(3) Wafer temperature: 650[° C.].

(4) Time: 20[sec].

Then, a tungsten film 16 is formed on the annealed titanium nitride film 15. The tungsten film forming processes have first and second CVD. Here, conditions of the first and second CVD are as follows:

First CVD:

(1) Gases: tungsten hexafluoride and silane.

(2) Gas flow rate: tungsten hexafluoride: 20[sccm] and silane: 10[sccm].

(3) Pressure: 500[pa].

(4) Wafer temperature: 500[° C.].

(5) Thickness: 25[nm].

Second CVD:

(1) Gases: tungsten hexafluoride and hydrogen.

(2) Gas flow rate: tungsten hexafluoride: 90[sccm] and hydrogen: 1000[sccm].

(3) Pressure: 10000[pa].

(4) Wafer temperature: 500[° C.].

(5) Thickness: 500[nm].

Then, the tungsten film 16 is etched back. As a result, the tungsten film 17 is buried in the contact hole 13.

The tungsten film forming process may be carried out without the etching back process.

As mentioned above, the preferred embodiment of the invention is characterized as follows.

First, to increase adhesion between the titanium film and a titanium nitride film, the plasma treating is carried out with a mixed gas of hydrogen and nitrogen. The mixed gas of hydrogen and nitrogen has a nitriding speed for titanium less than ammonia. As a result, the preferred embodiment of the invention can avoid the problem that the titanium film is completely converted the titanium nitride film is also nitridized.

Accordingly, the preferred embodiment of the invention can decrease a contact resistance of the tungsten interconnection in a contact hole.

While the present invention has been described with reference to the illustrative embodiments, this description is not intended to be construed in a limiting sense. Various modifications of the illustrative embodiments, as well as other embodiments of the invention, will be apparent to those skilled in the art on reference to this description. It is therefore contemplated that the appended claims will cover any such modifications or embodiments as fall within the true scope of the invention.

What is claimed is:

1. A method for forming a semiconductor device comprising:

providing a semiconductor substrate;

forming an insulating film on the semiconductor substrate, the insulating film having an opening;

forming a titanium film so as to extend from the semiconductor substrate in the opening to a surface of the insulating film;

plasma treating the titanium film with a mixed gas of hydrogen and nitrogen;

forming a titanium nitride on the plasma treated titanium film;

annealing the titanium nitride with ammonia;

forming a tungsten film on the annealed titanium nitride; and forming a tungsten interconnection by etching back the tungsten film, said forming a tungsten film consisting of a first chemical vapor deposition having a condition that gases are tungsten hexafluoride and silane, gas flow rates are 20 sccm for tungsten hexafluoride and 10 sccm for silane, a pressure if 500 pa, a temperature is 500° C., and a thickness of the tungsten film is 25 nm, and a second chemical vapor deposition having a condition that gases are tungsten hexafluoride and hydrogen, gas flow rates are 90 sccm for tungsten hexafluoride and 1000 sccm for hydrogen, a pressure is 10,000 pa, a temperature is 500° C., and a thickness of the tungsten film is 500 nm.

2. A method for forming a semiconductor device as claimed in claim 1, wherein the annealing is carried out for 20 seconds and has a condition that gas flow rate of the ammonia is 3000 sccm, a pressure is 1000 pa, and a temperature is 650° C.

3. A method for forming a semiconductor device as claimed in claim 1, wherein said forming a titanium film has a condition that gases are titanium tetrachloride and hydrogen, gas flow rates are 5 sccm for titanium tetrachloride and 1500 sccm for hydrogen, pressure is 500 pa, temperature is 650° C., thickness of the titanium film is 20 nm, and power is 450W.

4. A method for forming a semiconductor device as claimed in claim 1, wherein said plasma treating has a condition that gas flow rates are 1000-2000 sccm for hydrogen and 400-600 sccm for nitrogen, a pressure is 500 pa, a temperature is 650° C., a thickness of the plasma treated titanium film is 20 nm, and a power is 400-500W.

5. A method for forming a semiconductor device as claimed in claim 1, wherein said forming a titanium nitride has a condition that gases are titanium tetrachloride and ammonia, gas flow rates are 30-50 sccm for titanium tetrachloride and 300-500 sccm for ammonia, a pressure is 70 pa, a temperature is 650° C., and a thickness of the titanium nitride is 20 nm.

* * * * *